United States Patent
Chandaria et al.

(10) Patent No.: US 9,619,122 B2
(45) Date of Patent: *Apr. 11, 2017

(54) METHOD AND APPARATUS FOR AUTOMATIC DEVICE PROGRAM GENERATION

(71) Applicant: Ciambella Ltd., Tortola (VG)

(72) Inventors: Trisala Chandaria, New York, NY (US); Jean-Baptiste Leonelli, New York, NY (US)

(73) Assignee: Ciambella Ltd., Tortola (VG)

(*) Notice: Subject to any disclaimer, the term of this patent is extended or adjusted under 35 U.S.C. 154(b) by 112 days.

This patent is subject to a terminal disclaimer.

(21) Appl. No.: 14/685,064

(22) Filed: Apr. 13, 2015

(65) Prior Publication Data
US 2015/0286362 A1 Oct. 8, 2015

Related U.S. Application Data

(63) Continuation-in-part of application No. 14/593,151, filed on Jan. 9, 2015.
(Continued)

(51) Int. Cl.
*G06F 9/44* (2006.01)
*G06F 17/50* (2006.01)
(Continued)

(52) U.S. Cl.
CPC .......... *G06F 3/0484* (2013.01); *G06F 3/0482* (2013.01); *G06F 3/0487* (2013.01);
(Continued)

(58) Field of Classification Search
CPC .... G06F 3/0482; G06F 3/0484; G06F 3/0487; G06F 8/30; G06F 8/34; G06F 8/60; G06F 9/44; G06F 17/5045; G06F 17/5068
(Continued)

(56) References Cited

U.S. PATENT DOCUMENTS

| 5,623,604 | A |   | 4/1997 | Russell et al. | |
|---|---|---|---|---|---|
| 5,852,733 | A | * | 12/1998 | Chien | G06F 8/20 |
|   |   |   |   |   | 712/201 |

(Continued)

FOREIGN PATENT DOCUMENTS

EP 2498178 A1 9/2012

OTHER PUBLICATIONS

Marshall, "Remote Procedure Calls (RPC)", <https://www.cs.cf.ac.uk/Dave/C/node33.html>, Jan. 5, 1999, pp. 1-14.

(Continued)

*Primary Examiner* — Qing Chen
(74) *Attorney, Agent, or Firm* — Moser Taboada

(57) ABSTRACT

A method and apparatus for automatic generation of a device program including determining a controller from among a plurality of controllers displayed in a graphical user interface (GUI) on a user device communicatively coupled to a corresponding external controller, generating a user interactive pin layout in the GUI for the controller, displaying in the GUI, a plurality of operations for execution by the controller, determining an operation from among the plurality of operations for the controller, associating pins selected to parameters of the operation, receiving parameter data for the operation from at least one data entry field in the GUI, generating a program for the controller based on the user interactive pin layout, the received parameter data, the operation, and sending the program for storage in a memory on the controller, wherein at least one determined operation comprises communicating data with an external data service.

8 Claims, 10 Drawing Sheets

Related U.S. Application Data

(60) Provisional application No. 61/926,168, filed on Jan. 10, 2014.

(51) Int. Cl.
*G06F 15/04* (2006.01)
*G06F 3/0484* (2013.01)
*G06F 3/0482* (2013.01)
*G06F 3/0487* (2013.01)
*G06F 9/445* (2006.01)

(52) U.S. Cl.
CPC ............... *G06F 8/34* (2013.01); *G06F 9/44* (2013.01); *G06F 17/5068* (2013.01); *G06F 8/60* (2013.01)

(58) Field of Classification Search
USPC ............... 717/104–113; 716/100, 101, 139; 719/330
See application file for complete search history.

(56) References Cited

U.S. PATENT DOCUMENTS

| | | | |
|---|---|---|---|
| 5,887,172 A | 3/1999 | Vasudevan et al. | |
| 6,065,053 A | 5/2000 | Nouri et al. | |
| 6,108,715 A | 8/2000 | Leach et al. | |
| 6,266,809 B1 | 7/2001 | Craig et al. | |
| 6,324,681 B1 | 11/2001 | Sebesta et al. | |
| 6,366,300 B1* | 4/2002 | Ohara | G05B 19/056 700/83 |
| 6,401,156 B1* | 6/2002 | Mergard | G06F 13/24 710/260 |
| 6,490,723 B1 | 12/2002 | Bearden et al. | |
| 6,715,132 B1* | 3/2004 | Bartz | G06F 17/5045 715/764 |
| 6,931,288 B1 | 8/2005 | Lee et al. | |
| 6,966,039 B1* | 11/2005 | Bartz | G06F 8/30 715/764 |
| 7,010,773 B1* | 3/2006 | Bartz | G06F 17/505 716/121 |
| 7,043,715 B1 | 5/2006 | Bauer et al. | |
| 7,086,014 B1* | 8/2006 | Bartz | G06F 17/5045 345/594 |
| 7,127,705 B2 | 10/2006 | Christfort et al. | |
| 7,143,360 B1 | 11/2006 | Ogami et al. | |
| 7,784,030 B2 | 8/2010 | Christfort et al. | |
| 8,028,258 B1* | 9/2011 | Ogami | G06F 17/5068 716/110 |
| 8,078,970 B1* | 12/2011 | Anderson | G06F 17/5054 714/724 |
| 8,099,694 B1* | 1/2012 | Chan | G06F 17/5054 716/101 |
| 8,352,903 B1 | 1/2013 | Friedman | |
| 8,694,954 B2 | 4/2014 | Ortiz | |
| 8,752,033 B2* | 6/2014 | Mohammed | G06F 8/20 716/102 |
| 9,148,413 B1 | 9/2015 | Marr et al. | |
| 2002/0078168 A1 | 6/2002 | Christfort et al. | |
| 2002/0108006 A1* | 8/2002 | Snyder | G06F 1/08 710/100 |
| 2002/0169850 A1* | 11/2002 | Batke | G05B 19/056 709/218 |
| 2002/0194313 A1 | 12/2002 | Brannock | |
| 2003/0023839 A1 | 1/2003 | Burkhardt et al. | |
| 2003/0037181 A1 | 2/2003 | Freed | |
| 2003/0120707 A1 | 6/2003 | Bogdan et al. | |
| 2004/0034842 A1* | 2/2004 | Mantey | G06F 17/5077 716/102 |
| 2004/0040028 A1 | 2/2004 | Moreau | |
| 2004/0249944 A1 | 12/2004 | Hosking et al. | |
| 2004/0267926 A1 | 12/2004 | Rothman et al. | |
| 2005/0114644 A1* | 5/2005 | Chu | G06F 9/445 713/2 |
| 2005/0198624 A1 | 9/2005 | Chipman | |
| 2006/0020910 A1* | 1/2006 | Schlanger | G06F 8/60 717/101 |
| 2006/0041644 A1 | 2/2006 | Henseler | |
| 2006/0041854 A1* | 2/2006 | Schlanger | G06F 8/60 717/101 |
| 2006/0059447 A1* | 3/2006 | Ariyama | G06F 17/5068 716/126 |
| 2006/0259588 A1 | 11/2006 | Lerman et al. | |
| 2006/0277158 A1 | 12/2006 | Kim | |
| 2006/0277328 A1 | 12/2006 | Cherian et al. | |
| 2007/0142929 A1 | 6/2007 | Pereira | |
| 2007/0174037 A1* | 7/2007 | Ling | G06F 11/3648 703/28 |
| 2007/0234341 A1 | 10/2007 | Chang et al. | |
| 2007/0250800 A1* | 10/2007 | Keswick | G06F 17/5045 716/102 |
| 2007/0283072 A1* | 12/2007 | Johnson | G06F 11/3664 710/305 |
| 2008/0021994 A1 | 1/2008 | Grelewicz et al. | |
| 2008/0040093 A1* | 2/2008 | Sargaison | G06F 9/45504 703/28 |
| 2008/0082603 A1 | 4/2008 | Mansour et al. | |
| 2008/0109782 A1* | 5/2008 | Adelman | G06F 17/5027 716/116 |
| 2008/0163269 A1 | 7/2008 | Goto | |
| 2008/0222715 A1 | 9/2008 | Bansal et al. | |
| 2009/0171484 A1 | 7/2009 | Birze et al. | |
| 2010/0205273 A1 | 8/2010 | Shim | |
| 2010/0287571 A1* | 11/2010 | Mohammed | G06F 8/20 719/328 |
| 2010/0299187 A1 | 11/2010 | Duggal | |
| 2011/0154305 A1 | 6/2011 | Leroux et al. | |
| 2011/0179347 A1 | 7/2011 | Proctor et al. | |
| 2011/0271269 A1 | 11/2011 | Tazzari et al. | |
| 2012/0022674 A1* | 1/2012 | Choo | G06F 8/30 700/86 |
| 2012/0233589 A1 | 9/2012 | Mruthyunjaya et al. | |
| 2012/0233612 A1 | 9/2012 | Beckett | |
| 2013/0125089 A1* | 5/2013 | Mohammed | G06F 8/20 717/106 |
| 2013/0125107 A1 | 5/2013 | Bandakka et al. | |
| 2013/0271659 A1* | 10/2013 | Na | H04N 5/4403 348/563 |
| 2014/0040182 A1 | 2/2014 | Gilder et al. | |
| 2014/0109057 A1 | 4/2014 | Gibbens et al. | |
| 2014/0123124 A1 | 5/2014 | Gray et al. | |
| 2014/0215433 A1 | 7/2014 | Bergamaschi et al. | |
| 2014/0258986 A1 | 9/2014 | Wang et al. | |
| 2015/0046902 A1 | 2/2015 | Kumar et al. | |
| 2016/0012026 A1 | 1/2016 | Baikov et al. | |

OTHER PUBLICATIONS

Benso et al., "A Software Development Kit for Dependable Applications in Embedded Systems", Conference: Proceedings IEEE International Test Conference, 2000.
Alonso et al., "Computer Networks Exercise 4", ETH, 2006, pp. 1-6.
Battaglia et al., "An Open and Portable Software Development Kit for Handheld Devices with Proprietary Operating Systems", IEEE Transactions on Consumer Electronics, vol. 55, Issue 4, Nov. 2009, pp. 2436-2444.
Krzyzanowski, "Remote Procedure Calls", Oct. 30, 2012.
Bergen, "RPC Automation: Making Legacy Code Relevant", 8th International Symposium on Software Engineering for Adaptive and Self-Managing Systems (SEAMS), 2013, pp. 175-180.
Kasai, "Embedded Middleware and Software Development Kit for Area-Based Distributed Mobile Cache System", IEEE Transactions on Consumer Electronics, vol. 59, Issue 1, Feb. 2013, pp. 281-289.
International Search Report and Written Opinion mailed Oct. 30, 2014 for PCT Application No. PCT/US2014/046215.
International Search Report and Written Opinion mailed Oct. 31, 2014 for PCT Application No. PCT/US2014/042783.
International Search Report and Written Opinion mailed Oct. 31, 2014 for PCT Application No. PCT/US2014/042774.

(56) References Cited

OTHER PUBLICATIONS

International Search Report and Written Opinion mailed Nov. 3, 2014 for PCT Application No. PCT/US2014/042780.
International Search Report and Written Opinion mailed Apr. 22, 2015 for PCT Application No. PCT/US2015/010562.
International Search Report and Written Opinion mailed Aug. 11, 2016 for PCT Application No. PCT/US2016/031217.

* cited by examiner

METHOD AND APPARATUS FOR AUTOMATIC DEVICE PROGRAM GENERATION

CROSS-REFERENCE TO RELATED APPLICATION

This application is a continuation in part of, and claims priority to, U.S. patent application Ser. No. 14/593,151 filed on Jan. 9, 2015 which claims benefit of U.S. Provisional Patent Application No. 61/926,168 filed on Jan. 10, 2014, each of which is incorporated by reference herein in its entirety.

BACKGROUND OF THE INVENTION

Field of the Invention

Embodiments of the present invention generally relate to a method and apparatus for automatic device program generation.

Description of the Related Art

The use of field programmable gate arrays (FPGAs) and microcontrollers have grown considerably popular. Low manufacturing costs, availability, and customization of controllers have led to a proliferation of microcontrollers (e.g., PIC or ARDUINO and the like) being used by commercial companies and hobbyists alike for creation of devices. Microcontrollers are small computers on a single integrated circuit containing a processor core, and memory that are programmable for processing input/output data in communication with peripherals. Program memory in the form of NOR FLASH or OTP ROM is also often included on the microcontroller chip, as well as a typically small amount of random access memory (RAM). Microcontrollers are typically designed for embedded applications.

However, microcontrollers are generally limited to a given code set that must be within the capacity of on-board memory. As programs grow in complexity, the size of the code required to be stored in memory increases. Often, programmers resort to sacrificing potential programs to conserve usable memory space. In addition, programs are also limited to local functionality and restricted capabilities as defined by the local libraries native to the microcontroller and performance of the processor. At best, basic external communications are limited to interacting with a very small range of applications (e.g., programs stored locally on the microcontroller). Furthermore, programming microcontrollers is very challenging for users as one is to memorize coding commands, understand hierarchies, utilize proper calling syntaxes, and the like. Otherwise, a written program will fail to run or produce errors.

Thus, there is a need in the art for simplifying microcontroller programming and expanding microcontroller capability while maintaining a minimal memory footprint.

SUMMARY OF THE INVENTION

Embodiments of the present invention generally relate to a method, apparatus for automatic device program generation substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
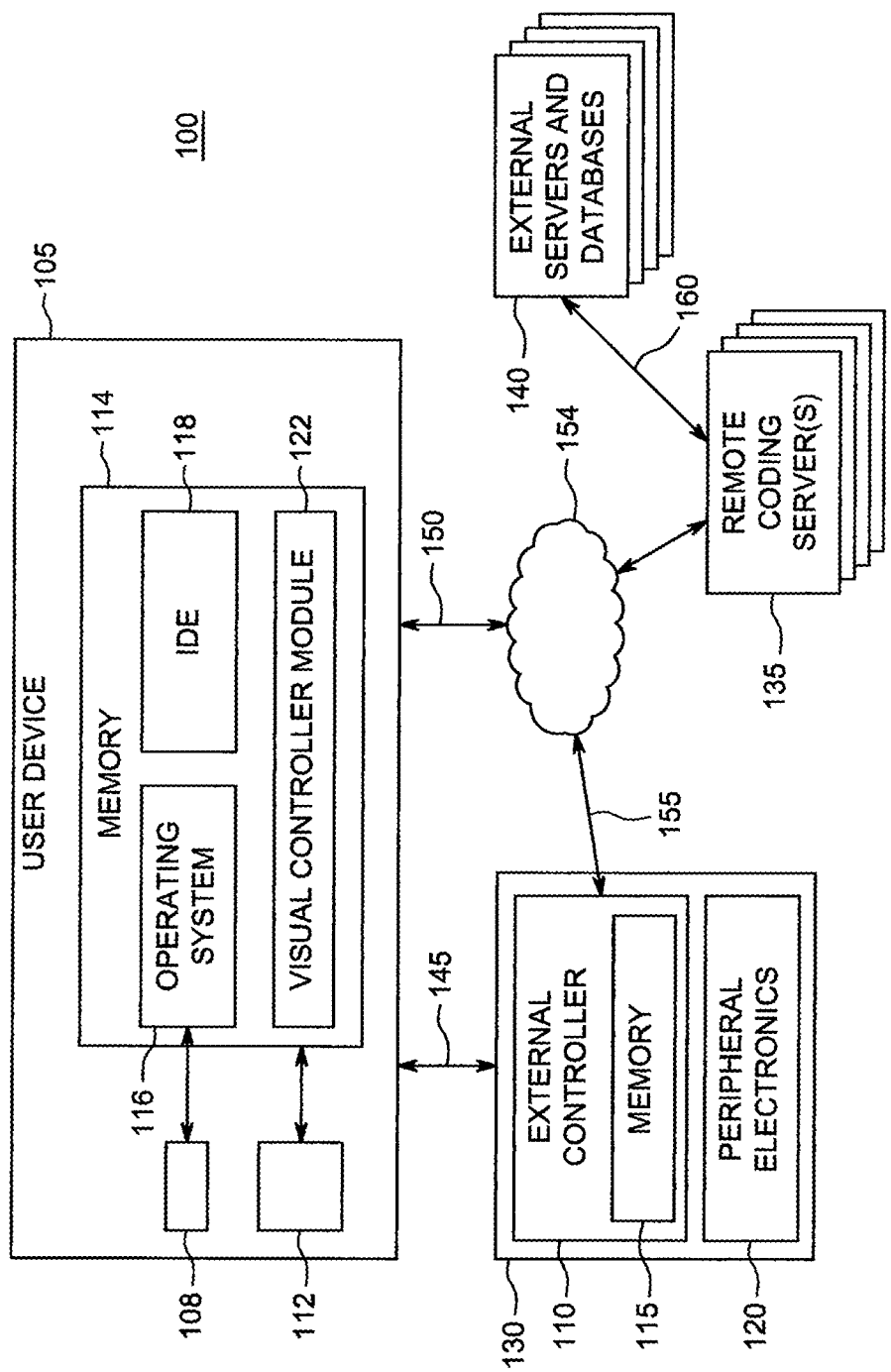
FIG. 1 is an overview diagram of the automatic device program generation system in accordance with one or more embodiments of the present invention.

Embodiments of the present invention relate to an automated device code generator, and more specifically to automatically generating a program for an external controller through a graphical interface. The graphical interface allows visualization of the physical controller for quickly selecting physical attributes (e.g., via a pin layout) and assigning the physical attributes as either input or output parameters for operations in the generated program. Such operations may include streaming data and/or pushing/pulling/sending data from a selected pin to a pre-defined service. Visual cues reduce the amount of time a user spends following a netlist or pairing a circuit diagram with the controller to properly execute a program on the external controller.

In some embodiments, the generated program expands the functionality of the external controller in the electronic device by executing remote process calls to a coding server or group of servers. The electronic device is a device that has at least one processor or a micro-controller to execute tasks.

Some embodiments of the electronic device includes programming boards such as: ARDUINO, TEXAS INSTRUMENTS LAUNCHPAD, FREESCALE BOARDS KINETIS, ST MICROELECTRONICS STM32, INTEL EDISON, and the like. Some embodiments of the electronic device for controllers may program controllers of other assembled devices and systems such as NEST THERMOSTAT, PHILIPPS HUE, BELKIN, WITHINGS, and the like.

The coding server performs a heavier processing load to execute more intricate programs that the external controller is restrained from performing due to hardware and software limitations (e.g., low power processor, limited memory capacity, reduced operating system, lack of instruction sets, and the like). The coding server may also execute commands to authenticate and access additional third party databases and services (e.g., AMAZON, EBAY, FACEBOOK, APPLE PUSH NOTIFICATION servers, text message servers, email servers, and the like).

Code is generated automatically for an external controller and operation via a customized graphical user interface (GUI). The code coordinates with a remote coding server that may also have a program mirroring the automatically generated code for the controller so as to handle incoming and outgoing processed data for the external controller. The GUI presents the selected controller and a pre-determined list of operations and libraries for the controller to access and generate calls to processes on the remote coding server. The GUI includes a representation of actual pins of the controller. The selection of pins in the pin layout are interpreted as data to be inserted into pre-generated code corresponding to process calls for the selected controller. In some embodiments, the process calls are to processes residing on a remote server or coding server. The automatically generated controller program (AGCP) stored on the controller may comprise a plurality of process calls. The process calls and associated data for variables are communicated to the remote coding server that stores and executes code using the variable data from the AGCP. After executing of the pre-generated code, the remote coding server filters, processes, and returns a formatted data that is native to the external controller type. In other embodiments, the AGCP also comprises traditional code and the process calls. Further embodiments include generation of code on the remote coding server to transmit to the controller for subsequent process calls.

In the described following embodiments, a "process" shall refer to a ready-to-run code base or pre-generated code that is already deployed on an execution computer (e.g., server, personal computer, mobile device, etc.). Each process is uniquely identified to the user by name, process ID, icon, or other identifier to the user. "Execution" shall refer to the launch of a process on a computer (local or remote, or Cloud based). A "bundle" shall refer to a collection of processes organized by a common attribute (API name, common parameters, SDK, parameter names, remote server, and the like). Examples discussed herein are not limiting in scope, but rather distinguishing specific embodiments for explanatory purposes.

FIG. 1 is an overview diagram of the automatic device program generation system 100 in accordance with one or more embodiments of the present invention. The system 100 comprises a user device 105, an integrated circuit device (i.e., electronic device) 130, a remote coding server 135, and an external server 140. In some embodiments, the remote coding server 135 is at least one of a plurality of remote coding servers. Similarly, in some embodiments the external server 140 is at least one of a plurality of external servers.

In some embodiments, the user device 105 and the integrated circuit device 130 are communicatively coupled via the Internet 154 or other network. However, for ease of explanation, the embodiments below contemplate the user device 105 is directly connected (e.g., via USB, parallel/serial data cable, network cable, and the like) to the integrated circuit device 130.

The integrated circuit device 130 comprises an external controller 110, and memory 115. In some embodiments, the integrated circuit device 130 further comprises peripheral electronics 120 coupled to the external controller 110. The peripheral electronics 120 include but are not limited to sensors, lights, audio speakers, actuators, displays, printers, scanners, I/O devices, and the like. The external controller 110 may be a microcontroller (e.g., PIC, ARDUINO YUN, and the like). The external controller 110 is communicatively coupled to the remote coding server 135 via the Internet 154, CLOUD, network or the like. In some embodiments, the external controller 110 is coupled to the remote coding server 135 after automatic program generation by the user device 105 and/or a corresponding header file and libraries are stored in memory 115 to execute instructions on the remote coding server 135. The header files allow execution of remote process calls on the remote coding servers 135.

The remote coding servers 135 store libraries, application program interfaces (APIs), and software development kits (SDKs) to execute the offered operations selected on the user device that have been integrated into an AGCP stored on the external controller 110. In some embodiments, the remote coding servers 135 store user accounts, credentials, and other data to execute remote process calls in the AGCP stored on the external controller 110. The remote coding servers 135 also uses program logic libraries, stored APIs, and credentials to interface with external servers 140 to execute remote process calls. The remote coding servers 135 receive parameter data embedded in remote process calls to deploy functions stored in the program logic libraries. In some embodiments, process calls correspond to predetermined code that may be pre-generated in a markup language (e.g., XML, JAVASCRIPT, and the like). Markup languages allow for allocation, parsing, and insertion of variable data and parameters into predetermined offered operations comprising pre-generated code. However, alternative embodiments include generating code upon receipt of parameter and variable data based on predetermined code syntaxes.

Following processing and execution on the remote coding servers 135, the remote coding servers 135 may translate received data into code native to the external controller 110 according to the remote process call and/or predetermined instructions of a user account stored on the remote coding server 135. In some embodiments, the remote coding servers 135 may also include a code generator and run time engine (not shown) to execute remote process calls. In such an embodiment, a remote process call received from the integrated circuit device 130 triggers a remote process that further generates code for deployment by the run time engine. The program may include code to access external servers 140 via the code utilities that may be external or internal and include external APIs. A code utility is a routine that solves a technical problem such as date translation, file translation, encryption, debugging, and the like.

The external servers 140 include computers that host third party databases and services that are accessed via executable instructions. External servers 140 include private and public servers such as AMAZON, EBAY, TWITTER, email servers, text message servers, bank accounts, servers that provide data services and the like. The external servers 140 are directly connected to the remote coding server 135 (shown as arrow 160). In other embodiments, the external servers 140 are communicatively coupled to the remote coding server 135 via the Internet 154 or other network.

The user device 105 may be a computer, laptop, tablet, or other electronic processing device with a user interface and an integrated development environment (IDE). The user device 105 comprises a CPU 108, support circuits 112, and memory 114 containing instructions and algorithms. The CPU 108 processes inputs and outputs to the user device 105. The CPU 108 may be any commercially available processor, microprocessor, microcontroller, and the like. The support circuits 112 comprise well known circuits that provide functionality to the CPU 108 such as a user interface, clock circuits, network communications, cache, power supplies, I/O circuits, and the like. Alternative embodiments may use control algorithms on a custom Application Specific Integrated Circuit (ASIC). In some embodiments, the user interface comprises a keypad, electronic buttons, speaker, touchscreen, display, or other user interaction mechanism. In some embodiments, the user interface may communicate with the integrated circuit device 130.

The memory 114 may be any form of digital storage used for storing data and executable software. Such memory includes, but is not limited to, random access memory, read only memory, disk storage, optical storage, and the like. The memory 114 stores computer readable instructions corresponding to: an operating system 116, IDE 118, and visual controller module 122. The visual controller module 122 is described as a singular module for ease of explanation, however other embodiments include specific processes isolated to separate modules to improve storage or processing efficiency.

The visual controller module 122 communicates with the remote coding server(s) 135 (arrow 150) to retrieve pre-generated bundles and operations that may be performed by the remote coding server 135. The remote coding server 135 stores in a program logic library APIs, SDKs, and in some embodiments pre-generated code corresponding to remote process calls. The visual controller module 122 communicates with the remote coding server 135 via the Internet 154 and/or other network. The visual controller module 122 generates a library of selectable operations for the user to select to incorporate into an AGCP for the external controller 110. The library may be downloaded (shown as arrow 150) via the Internet 154 from the remote coding server 135.

In some embodiments, the visual controller module 122 and IDE 118 further stores a process or program for the AGCP on the remote coding server 135. Storing a program corresponding to the AGCP allows the remote coding server 135 to listen for data from the external server 140 and perform additional processing and sending the data to the external controller 110. For example, a AGCP may be generated to light an LED coupled to a pin of the external controller 110 whenever a TWEET is received by a user. The TWEET is not directly received by the external controller 110. Rather, a TWEET received to a user account may trigger a notification to the remote coding server 135 that has user account authentication credentials to access TWITTER. The remote coding server following a program from the visual controller module 122 translates the TWEET notification into a "PIN 7 HIGH" command and communicates the command to the external controller 110. The external controller 110 following the AGCP, waits for the PIN 7 HIGH command and subsequently sets PIN 6 LO to turn off a connected LED. Thus in the example above, a program on the remote coding server 135 must be prepared to properly implement the AGCP on the external controller 110.

The visual controller module 122 also generates a visual representation of the external controller 110 that represents the topology of the external controller 110. As will be discussed further below, the visual representation may be a pin layout. Selections are made in the pin layout associate the selected pins with variables in for the program. For example, the user may specify on the pin layout of certain peripheral electronics coupled to the pins such as sensors (e.g., thermometer, photodiodes, microphones, voltmeters, and the like) and actuators (motor, relay, and the like).

The visual controller module 122 receives additional parameters for the program in predetermined fields corresponding to functions of the selected operation. The visual controller module 122 then communicates with the IDE 118 to automatically generate a packaged program with the selected operation, pin data, and parameters in a native language of the controller and communicates the program to the external controller 110 (shown as arrow 145) to be stored in memory 115. In some embodiments, the IDE may send corresponding header files and simplified instructions to access the remote coding server 135 for execution of remote process calls.

In operation, the user may select an operation to send a text message (e.g., specified in a field) when a coupled temperature sensor reaches a certain temperature value. The user selects the pins physically coupling the external controller 110 and to the temperature sensor. The user may also select the pins corresponding to connected communication circuitry to access the Internet 154. Once completed, the IDE 118 automatically compiles a program with the associated pin and field data to send the text message using a remote process call to a text message process stored on the remote coding server 135. The remote coding server 135 then receives instructions via the Internet 154 and accesses predetermined APIs to send the text message via the external servers 140 (shown as arrow 160). The external controller 110 may be disconnected from the user device for independent execution of the automatically generated controller program (AGCP).

In embodiments where the external controller 110 is to receive data initiated from the Internet 154, the remote coding server 135 stores a corresponding program to coordinate with the AGCP. In an example where the external controller 110 is to flash a LED every time a FACEBOOK post is received, the remote coding server 135 has a pre-generated process or stored program to login based on a user credential to FACEBOOK. The program subsequently listens for a FACEBOOK notification, translates the notification to a corresponding external controller 110 command (e.g., PIN 8 HIGH) in a native language of the controller. The program transmits the PIN 8 HIGH command via the Internet 154 to the external controller 110. The external controller 110 then processes the PIN 8 HIGH command using the AGCP stored in memory 115.

In other embodiments, a pin may be identified that will be used to stream data and/or push/pull/send/otherwise communicate data to/from a data service for remote storage or further processing (e.g., a web service).

Figure 2:
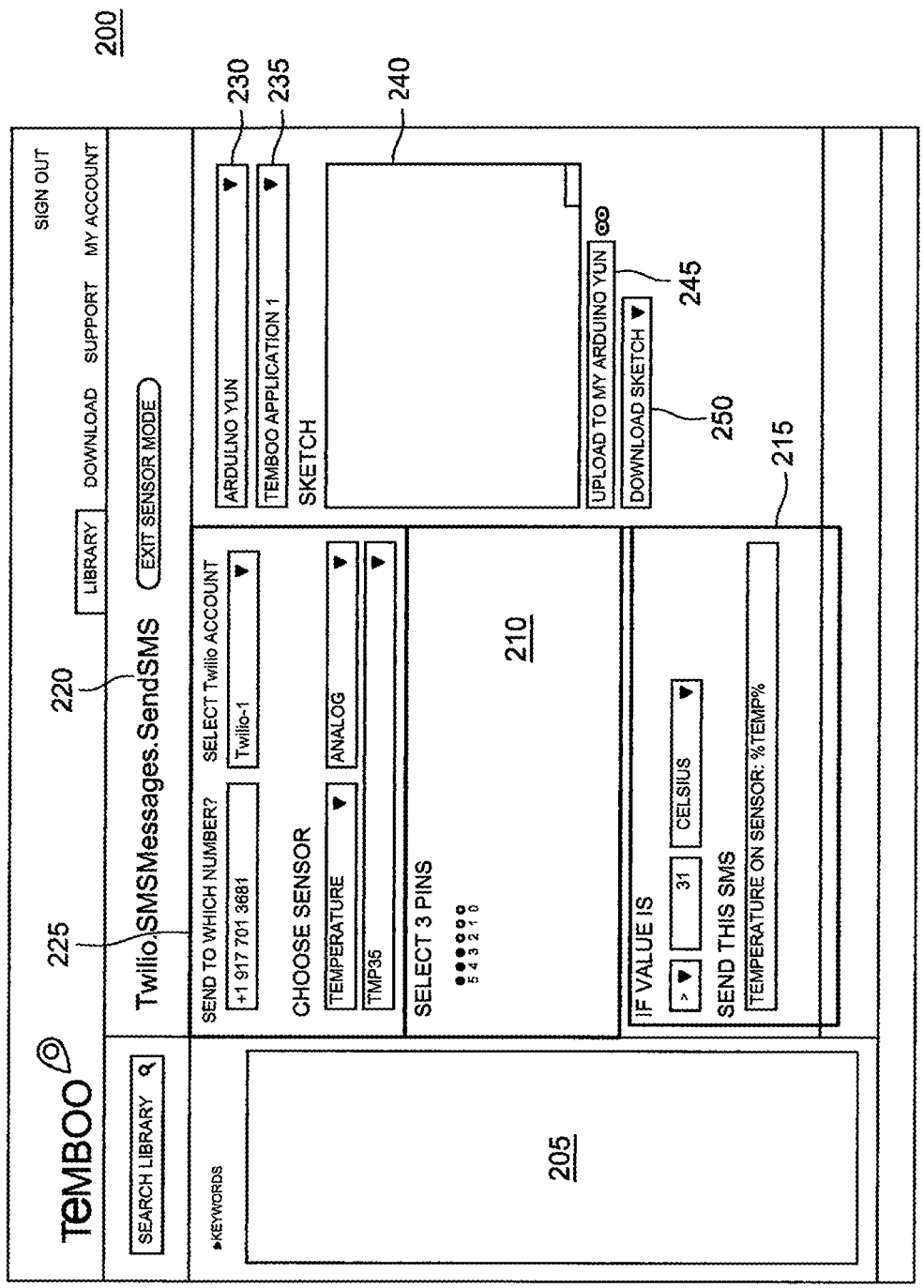
FIG. 2 is a diagram of an exemplary graphical user interface (GUI) for programming device specific hardware with interactive hardware visualization in accordance with one or more embodiments of the present invention.

FIG. 2 is a diagram of an exemplary graphical user interface (GUI) 200 for programming device specific hardware with interactive hardware visualization in accordance with one or more embodiments of the present invention. The GUI 200 contemplates operation in the system 100 described above in FIG. 1.

The GUI 200 is presented as part of the IDE 118 discussed above in FIG. 1. The GUI 200 comprises a services module 205, a pin layout 210, operation parameter modules 215 and 225, controller layout module 230, application selection module 235, coding window 240, and deployment button 245. The services module 205 comprises instructions for organizing and presenting operations that may be selected by the user via the GUI 200 such that a specific operation may be programmed using only parameters entered by the user. The services module 205 generates user selectable bundles of operations offered by the IDE 118, remote coding server 135, and external servers 140. In some embodiments, the services module 205 downloads an updated list of operations from the remote coding server 135.

The controller layout module 230 stores and recognizes various controller types that may be programmed by the IDE 118. The controller layout module 230 determines compiling languages and data communication instructions to interface and store programs on various controllers. The controller layout module 128 also comprises instructions and details for interfacing generating the pin layout 210 with the IDE 118 and UI during programming by a user. As will be described further below, pins are selected by the user to associate with the selected operation 220. Additional embodiments, include a count feature of required number of pins to deploy the selected operation as shown in pin layout 210. The user selected or automatically determined external controller 110 is identified by the controller layout module 230 (shown as ARDUINO YUN).

The application selection module 235 is for naming and storing at least one program to be automatically generated for the controller layout module corresponding to an external controller 110. In the described embodiment, the application sends a text message when a specific temperature is sensed by a temperature sensor coupled to the external controller 110. The code corresponding to the program to be generated is displayed in the coding window 240. The coding window 240 may also be edited by the user to make specific customizations to the code prior to storing on the external controller 110 and memory 115. Selection of the deployment button 245 translates, and communicates the program in the native language of the external controller 110. In some embodiments, the translation may be a compiling function. An optional embodiment includes a download button 250 for exporting the automatically generated code to a different file format (e.g., .js, .txt, .xml, and the like). One of routine skill in the art would recognize button as described herein includes any user selectable icon, text, or visual interface.

For example, the selected operation 220 is to send a short message service (SMS) text message. The destination number for the text message is entered into the corresponding field in the parameter module 225. In addition, the selected pins are to correspond with an analog temperature sensor that is also specified in a pre-determined field in the parameter module 225 for the operation (e.g., temperature sensing) selected from the services module 205. Additional parameters required for the temperature sensing is requested in operation parameter module 215. The GUI 200 displays only required parameter data for selected operations.

In operation, the SMS text message is sent by calling a remote process on the remote coding server 135. The external controller 110 communicates to the remote coding server 135 via stored instructions (e.g., a header file). The process deploys predetermined code to send the SMS text message by locating gateways and lookup tables for the user specified phone number and to access SMS servers.

In other embodiments, the data (e.g., temperature) may be identified as a data stream by the user and assigned to a pin for streaming data to a specific data service. Alternatively, a pin can be assigned to be used for pushing/pulling/sending data to and/or from a data service. Such services may store the data remotely or may provide additional processing via a web service.

In an exemplary system, the system may use a TEMBOO service as the code generation service. A TEMBOO client (GUI 200) is used as a connectivity client in the ARDUINO controller that is running a SKETCH program flashed onto the ARDUINO controller. The system uses an exemplary HTTPS communication protocol to reach the TEM BOO code generation servers that have pre-generated code and operations (e.g., over 2000 "smart code processes"). The pre-generated code utilizing databases, code utilities, APIs, and custom processes to implement the SKETCH flashed to the ARDUINO controller that contains calls to smart processes on the TEMBOO servers. ARDUINO represents an example of a myriad of possible microprocessors and controllers that are available and may become available for use with the embodiments discussed herein.

Figure 3:
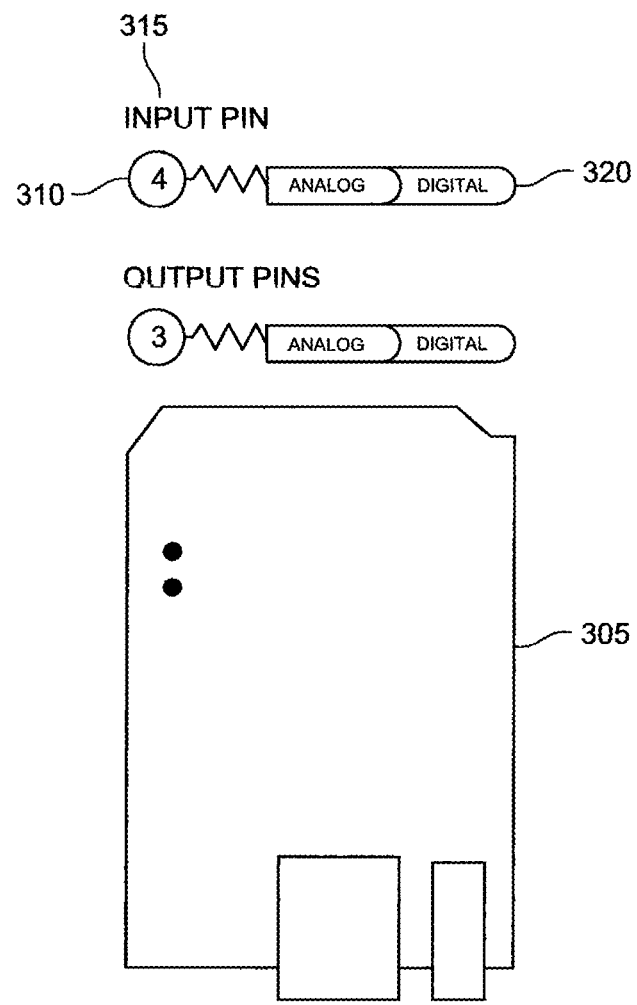
FIG. 3 is a diagram of an exemplary graphical user interface (GUI) for interactive hardware visualization in accordance with one or more embodiments of the present invention.

FIG. 3 is a diagram of an exemplary graphical user interface (GUI) for interactive hardware visualization in accordance with one or more embodiments of the present invention. The diagram is an exemplary pin layout 305 similar to the pin layout 210 described in FIG. 2 above. The pin layout 305 includes highlighted or accentuated pins 3 and 4 that have been selected to associate with an operation of the AGCP discussed above. Accentuated pins may be in various colors, symbols, flashing, shapes and other forms of visual distinction from pins not selected or corresponding to an operation. In some embodiments, accentuated pins employ combinations of accentuation to indicate progress in programming. In other words, a pin may be a flashing red when lacking variable parameter for the peripheral connected and green if the variable parameter has been entered. For example, pins selected for coupling to a motor may flash red until all parameters are entered in a corresponding operation parameter module 215 such as a detected current draw in an operation measuring motor loading.

A selected pin 310 may be designated a role in the automatic generated program such as an input pin 315, output pin, clock signal, and the like. In some embodiments, the pins may be labeled with customized functions for faster user recognition of the pin layout (e.g., lights, thermometer, motor, etc.). The selected pin 310 is also set to receive or output a signal type 320 such as analog or digital signals. The selected pin, signal type, and operation data are integrated into the AGCP discussed above in GUI 200.

The GUI 200 overall thus allows visualization of the external controller 110 via a pin layout 332 as well as simplifies programming the selected operation 220 desired by the user on the external controller 110. Selections made on the displayed pin layout 305 allow visual coordination of physical pin functions and if the pin is designated as an output pin, input pin, clock, and the like. Visual cues reduce the amount of time a user spends following a netlist or pairing a circuit diagram with the controller to properly execute a program on the external controller 110.

Figure 4:
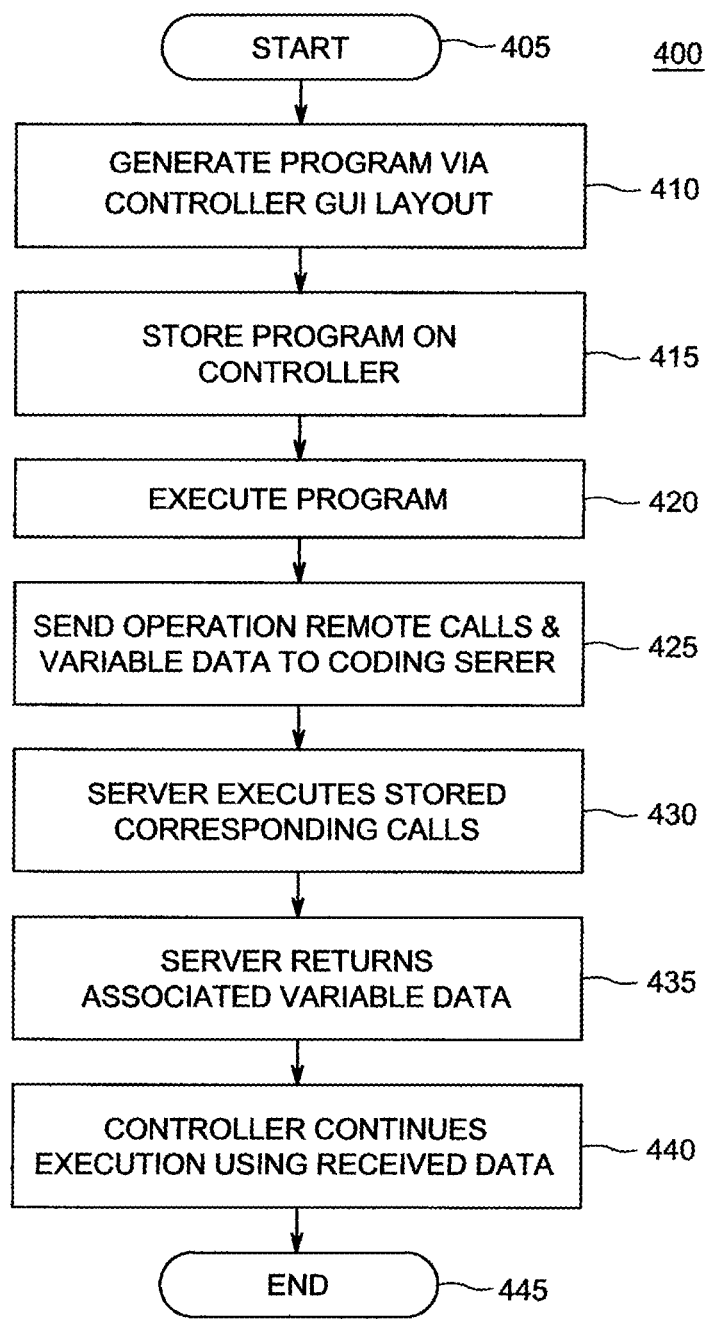
FIG. 4 is a flow diagram of a method performed by a controller for executing an automatically generated device program interacting with a remote service in accordance with one or more embodiments of the present invention.

FIG. 4 is a flow diagram of a method 400 performed by the external controller 110 for executing an automatically generated device program interacting with a remote service in accordance with one or more embodiments of the present invention. The method 400 is implemented by the remote coding server 135, external controller 110, and GUI 200. In some embodiments, the GUI 200 is on the user device 105 such as a host computer.

The method 400 begins at step 405 and continues to step 410. At step 410, a program is automatically generated based on the selected controller layout, selected operations, parameters, via the GUI 200 and IDE 118. Through the GUI 200, a user is able to select pins on the visual pin layout 219 of a selected controller as well as select a type of peripheral connected to the pin and in the IDE 118 enter variable data to generate code for the external controller 110. The generated program comprising process calls to operations on the remote coding server 135 as well as native code related to local controller functions. For example, the generated program may be for sending a text message whenever the external controller 110 detects a temperature exceeds 31 degrees Celsius as in FIG. 2. The program thus includes a process call to sending a text message that is executed by the remote coding server 135 (e.g., via a run time engine) based on local commands reading a voltage on specified pins of the external controller 110 coupled to a temperature sensor.

The AGCP may be transferred wirelessly (e.g., Wi-Fi, cellular, and the like) or wired (e.g., USB, CAT5, and the like) to the external controller 110. In some embodiments, the memory 115 is "FLASHED", or otherwise overwritten entirely by the program including header files to access the remote coding server 135. In some embodiments, storing the program onto the external controller 110 includes translating or compiling code into a different computer language (e.g., machine language).

At step 415, the program for the external controller 110 is stored onto the memory 115. At step 420, the AGCP begins execution on the external controller 110. In some embodiments, the external controller 110 samples and generates data from associated attached peripheral electronics 120. Continuing the example, external controller 110 begins reading analog voltage levels generated by the temperature sensor for ambient temperature conditions.

The method 400 continues to step 425 to send remote process calls and associated variable data to the remote coding server 135 with a code generation service such as the TEMBOO service. Continuing the example, once the temperature is read as exceeding the temperature threshold, the external controller 110 executes a remote process call to send a text message via communicating a call to a text message operation stored as pre-generated code on the remote coding server 135.

At step 430, the remote coding server 135 executes pre-generated code by inserting the variable data into pre-generated code stored on the remote coding server 135. Continuing the example, the remote coding server 135 retrieves pre-generated code for sending an SMS text message and inserts a text string message as well as a recipient phone number specified during the automatic program generation using the GUI 200. The remote coding server 135 then deploys the code to a network using associated Internet and cellular protocols such that the recipient device associated with the phone number receives the text message.

At step 435, the external controller 110 receives data in a language native to the external controller 110 from the remote coding server 135 service such as associated variable data. The remote coding server 135 may translate the data from a programming language used to execute the process call into the native language. The external controller 110 receives the associated variable data has been formatted by the code generation service into a native format (e.g., binary data, high or low signals, numerical values, strings and the like) for efficient processing by the external controller 110 selected by the user during programming. The user may optionally identify a pin through which the data may be streamed and/or pushed/pulled/sent directly to an external controller 110 or any other service such as remote storage or a web service to facilitate further data processing.

Continuing the example, the user program 141 may also include instructions to light an LED coupled to pin 5 when the text message is successfully sent. In such an instance, the variable data includes code for setting pin 5 high. In alternative embodiments, the variable data may be a data that is decoded by the external controller 110 into a value to execute the AGCP. In such an example, a "51" may be sent to the external controller 110 listening for data corresponding to a numerical 51, that subsequently uses local stored logic to parse or decode the first digit as the pin number and the second digit as either high ("1") or low ("0").

At step 440, the external controller 110 continues execution of the AGCP using the received data from the remote coding server 135. Finishing the example, the external controller 110 selectively redirects local power coupled to the external controller 110 to place a voltage bias on pin 5 so as to light a coupled LED to pin 5 and ground. The method 400 ends at step 445.

Figure 5:
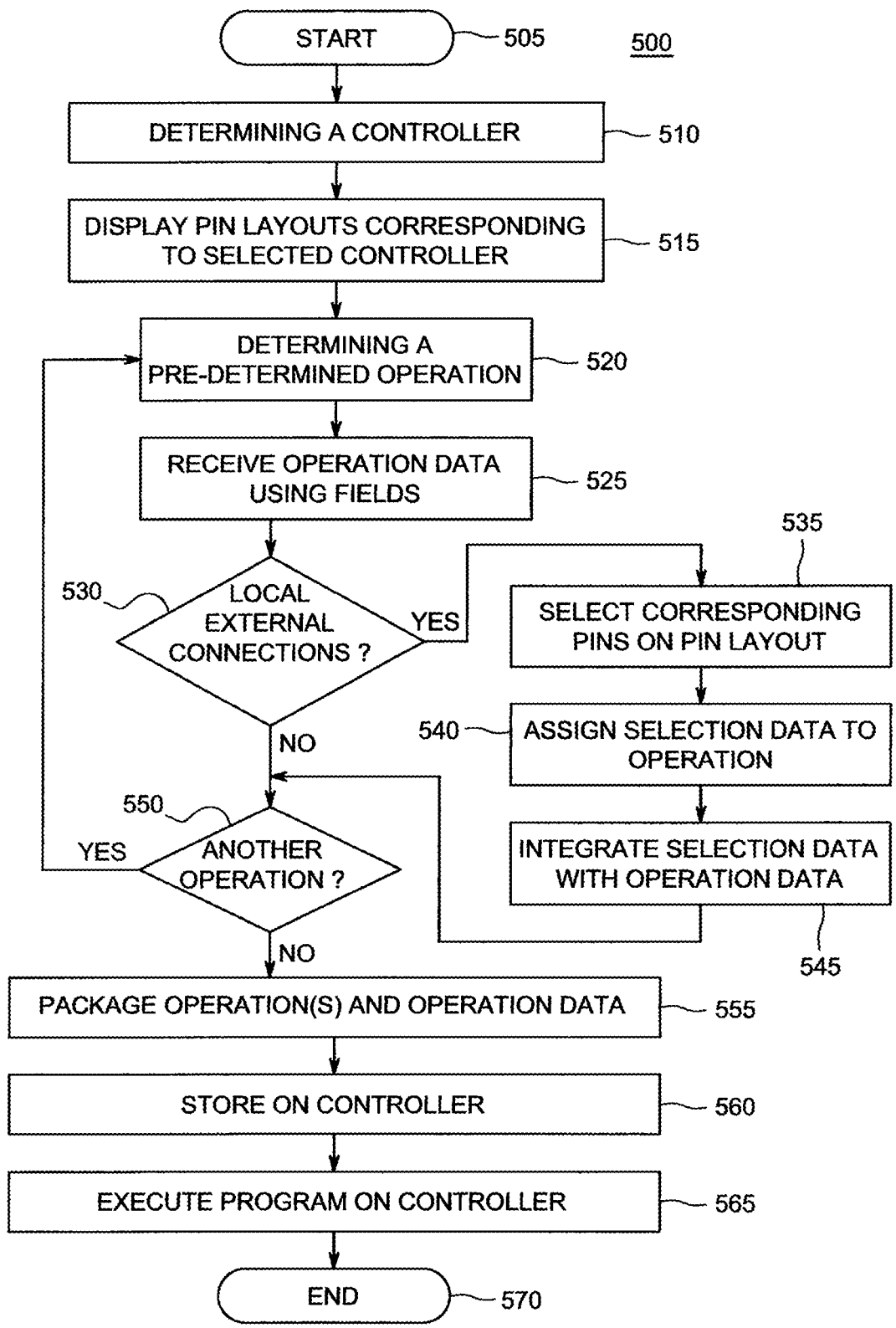
FIG. 5 is a flow diagram of an exemplary method for automatic device program generation interaction with the exemplary GUI in FIG. 2 in accordance with one or more embodiments of the present invention.

FIG. 5 is a flow diagram of an exemplary method 500 for automatic device program generation interaction with the exemplary GUI 200 in FIG. 2 in accordance with one or more embodiments of the present invention. GUI 200 is implemented by the user device 105 to program the external controller 110.

The method begins at step 505 and continues to step 510. At step 510, a type of controller is determined as selected from a pre-determined plurality of controllers displayed as a list, selectable group of icons, and the like. By selecting the controller, the visual controller module 122 retrieves and populates details unique to the selected controller such as known libraries, pin configurations, pin operations, maximum voltage/current tolerances, clock frequencies, and the like. In some embodiments, the determination of a selection is based on automatically detecting a type of the external controller 110 connected to the user device 105.

Next at step 515, a visual layout of the selected controller is displayed in the GUI 200. The visual layout includes a pin layout 210 that is selectable and interactive for programming the external controller 110. In some embodiments, the pins are highlighted for assigned functions that have been used in other selected operations in the program. In other embodiments, additional displayed data from an accompanying microcontroller datasheet may be extracted and populated to assist the user in programming and generating a visualization of the external controller 110.

Next, at step 520, a determination is made in selection of a pre-determined operations is received in the GUI 200. The pre-determined operation includes selection among bundles of services presented by the services module 205 for external electronic services on external servers 140 as well as pre-determined local functionalities for the external controller 110 or a combination of the electronic service and local function. For example, TWEETING may be selected as an external service and listening for an input (e.g., a short circuit across two pins) from an attached push-button may be a local function. Thus, a combination example would be TWEETING a specific message each time the push button is pressed.

Next at step 525, parameter data is received for the operation using pre-determined fields or drop down menus to be entered by a user. Additional embodiments include selecting radio buttons, check boxes, file attachments, and other input interfaces in the IDE 118. In other embodiments, the parameter data is retrieved from an external database. By only accepting operation data as variable data for generating the program, programming becomes visually simplified from the user perspective as only the desired operation and operating parameters need to be known. More advanced software developers or users may edit the generated code corresponding to the selections and entries made in the associated coding window 240. The method 500 then continues to step 530.

At step 530, a determination is made whether there will be local external connections to respective pins of the external controller 110 besides those for normal base operation (e.g., power, clock, communications, memory, and the like) for the selected operation. Such external connections may communicate data to and/or from external data services such as storage and/or web services. If determined there are to be no additional connections, the method 500 continues to step 550 to determine whether another operation is to be inserted into the AGCP.

However, if additional connections are to be made for the selected operation, the method 500 continues to step 535. At step 535, pins are selected on the pin layout 210 for corresponding pins of the selected operation. Next at step 540, the pin selection is assigned to the operation by associating the language representing a pin for the external controller 110 in the selected operation. For example if pin 5 is selected, in a controller for input, the command for the selected controller may be "PIN IN 5" and inserted in the coding window 345 for the selected operation. In additional embodiments, step 540 also assigns pin selections for other selected operations in the generated program such as when more than one operation may require use of a pin on the external controller 110.

The method 500 then continues to step 545 to integrate the pin selection and assignment with the required data parameters from the fields to finish the operation call. Continuing the example, an "if then" statement is created for the process operation by inserting the selected pin. A sample code may appear as: "IF PIN IN 5==1 THEN Temboo.Tweet (tittle Red Button Pushed!')" in the coding window 240. Alternative embodiments may include more pin selections depending on whether the selected operation utilizes many pins. The method continues to step 550.

At step 550, the method 500 determines whether additional operations are to be added to the AGCP. If additional operations are to be added, the method 500 reverts to step 520. If however, no additional operations are to be added, the operation(s) and operation data are packaged or integrated in step 555.

At step 555, all operations are packaged for storing or flashing onto the external controller 110. Packaging includes compiling or translating files into the native format accepted by the selected controller. Additional embodiments include header files containing instructions for accessing the remote coding server 135. In some embodiments, when packaging a program to be compiled, code libraries that are necessary for execution of the program and selected operations are also packaged. For example, if the operation requires an Internet connection an HTTP or HTPPS library is to be included or if multi-threading is required for the operation, a different library is to be included to be compiled and linked together before translating the program for the selected controller.

At step 560, the generated program is stored or flashed to the external controller 110. At step 565, the controller executes the AGCP on external controller 110. In some embodiments, execution of the AGCP includes remote process calls to processes corresponding to the selected operations discussed above. The processes are deployed on the remote coding server 135 from the external controller 110 via the Internet 154 or other network. Further still are embodiments that return response data in the native language to the external controller 110 after processing by the remote coding server 135. The method 500 ends at step 570.

Figure 6:
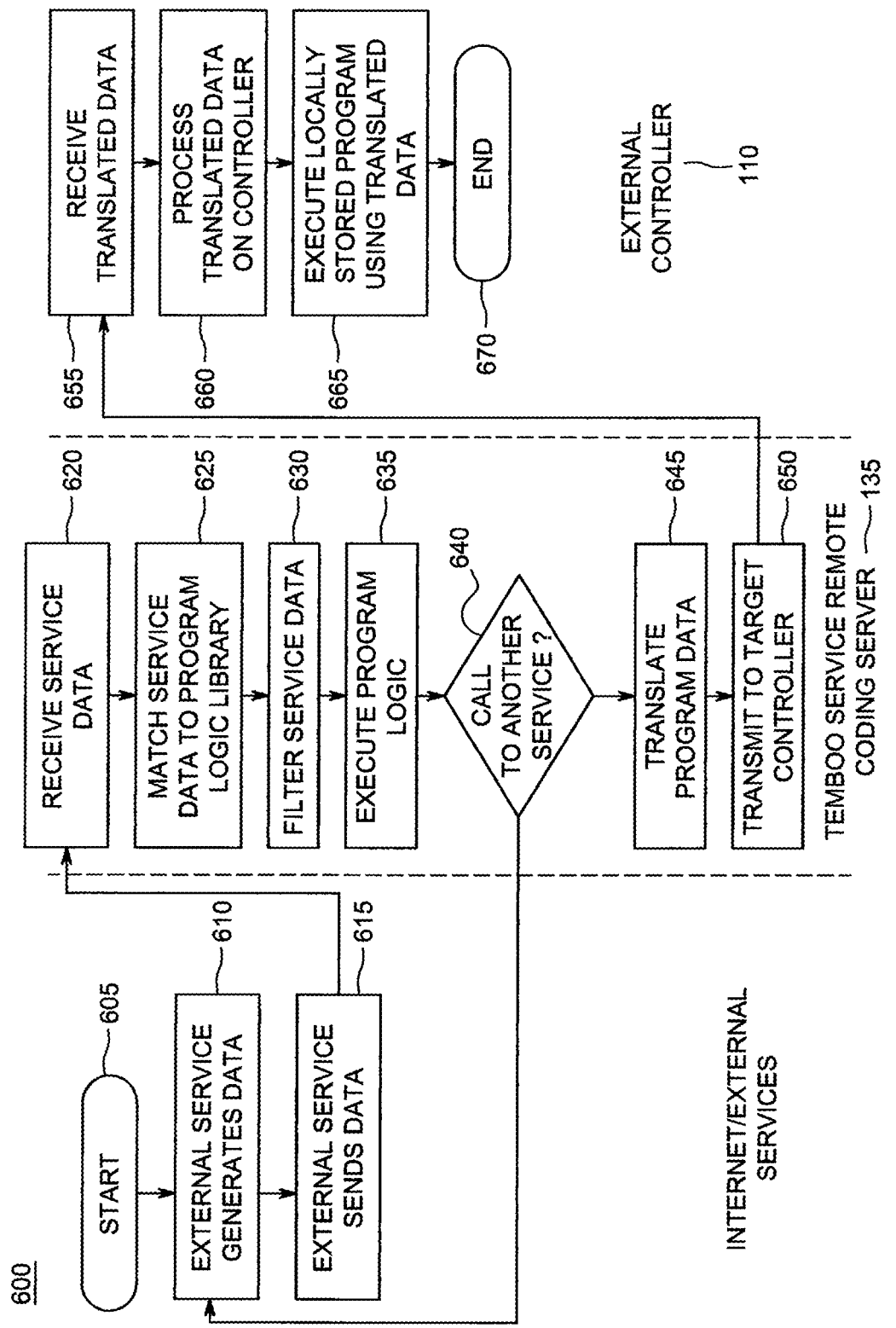
FIG. 6 is a flow diagram of an exemplary method performed by a coding server for remote process calls by an external controller programmed via the exemplary GUI in FIG. 2 in accordance with one or more embodiments of the present invention.

FIG. 6 is a flow diagram of an exemplary method 600 performed by a coding server for remote process calls by an external controller 110 programmed via the exemplary GUI 200 in FIG. 2 in accordance with one or more embodiments of the present invention.

The method 600 occurs when the remote coding server 135 receives data from an external service on an external server 140. The remote coding server 135 processes the received data and accordingly returns translated data to the external controller 110 based on a program stored on the remote coding server 135. In some embodiments, the program stored is coordinated with an AGCP on the external controller 110.

The method 600 begins at step 605 and continues to step 610 wherein the external server 140 receives service data from the Internet or generates data corresponding to a process on the remote coding server 135. The external service may be previously authenticated by the remote coding server 135. For example an AGCP may flash a LED coupled to the external controller 110 every time an email server receives a new email message and the remote coding server 135 must be authorized to check/receive email inbox notifications. An alternative example would flash the LED when a comment is made to a FACEBOOK status that also requires storing FACEBOOK authentication credentials. At step 615, the external server 140 data sends a notification to the remote coding server 135 (e.g., TEMBOO service).

At step 620, the remote coding server 135 receives the service data from the external server 140. At step 625, the remote coding server 135 matches the service data to a process in the program logic library and a user program stored on the remote coding server 135. The program logic library may include pre-generated code. Pre-generated code is organized according to an associated service (e.g., e-mail, FACEBOOK, text message, and the like) or logic operation (e.g., count, if/then conditional statements, and the like). Continuing the example, the process is an email notification matching a user account or recipient email address stored on the remote coding server 135 according to a program stored according to the GUI 200 and external controller 110. In the above example, a user may have a user account or program stored on the remote coding server 135 listening for service data from external services.

At step 630, the parameter data for variables is extracted/parsed from the service according to the program logic library. Data for the variables, or parameter data is filtered for preparation of insertion into pre-generated code for additional processing. The filtering and insertion is based on pre-determined relationships in coding syntax (e.g., IF-THEN, variable type, equations, and the like) as well as operations specified in the program. Continuing the example above, the email notification service data may include additional information such as time of receipt, message topic, message body, that is not required by the predetermined process in the program logic library.

At step 635, additional processing is performed based on the parsed service data by executing additional operations according to stored pre-generated processes and functions associated with the program to generate program data via a runtime engine. The program is associated with the AGCP discussed in methods 400 and 500 on the remote coding server 135. For example, the program logic library may have a parameter to simultaneously check other email accounts for messages.

At step 640, the remote coding server 135 determines whether the program stored on the remote coding server 135 is to call additional service data from one or more external servers 140 (e.g., TWITTER, EBAY, emergency text notifications, and the like). If determined the program requires additional service data, the method 600 returns to step 610. If however, a determination is made no additional service data is required, the method 600 proceeds to step 645.

At step 645, the program data from the program logic in step 635 is translated into the native language or signal for the target controller of the program. The target controller may be specified in the program or according to a user account preference. At step 650, the translated program data is transmitted to the external controller 110. The data is transmitted using communication circuits of the remote coding server 135. The translated program data may be substantially indistinguishable from data that would be generated internally and/or expected by the external controller 110 to further provide efficient processing.

At step 655, the external controller 110 receives the translated program data. The translated program data may be received via a network, the Internet, or a direct connection. Next at step 660, the translated program data is readily processed on the external controller 110. At step 665, the external controller 110 executes the stored instructions in memory 115. In some embodiments, the stored instructions correspond to an AGCP using the translated data. The method 600 then ends at step 670.

Figure 7:
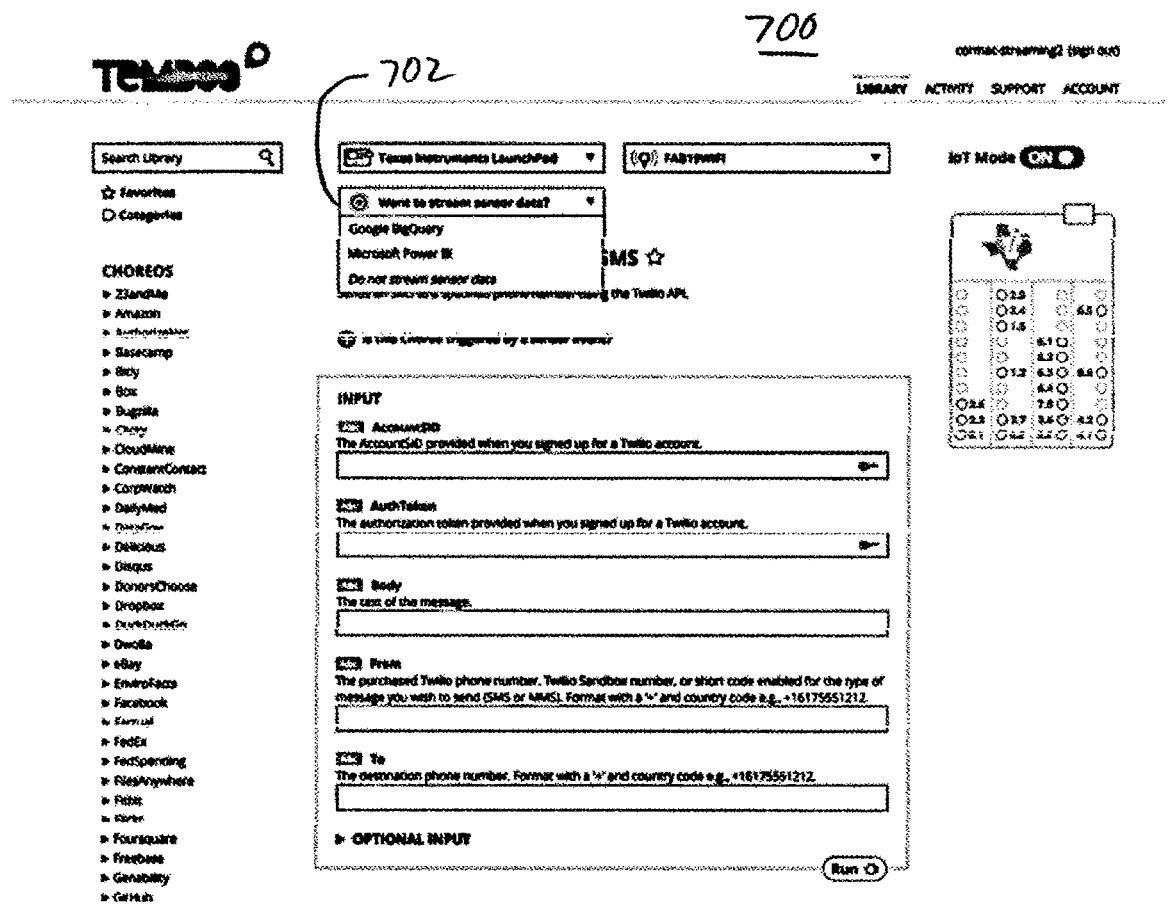
FIGS. 7-9 depict a sequence of GUIs used to select a data service and a pin through which data is to be streamed to the data service.
Figure 8:
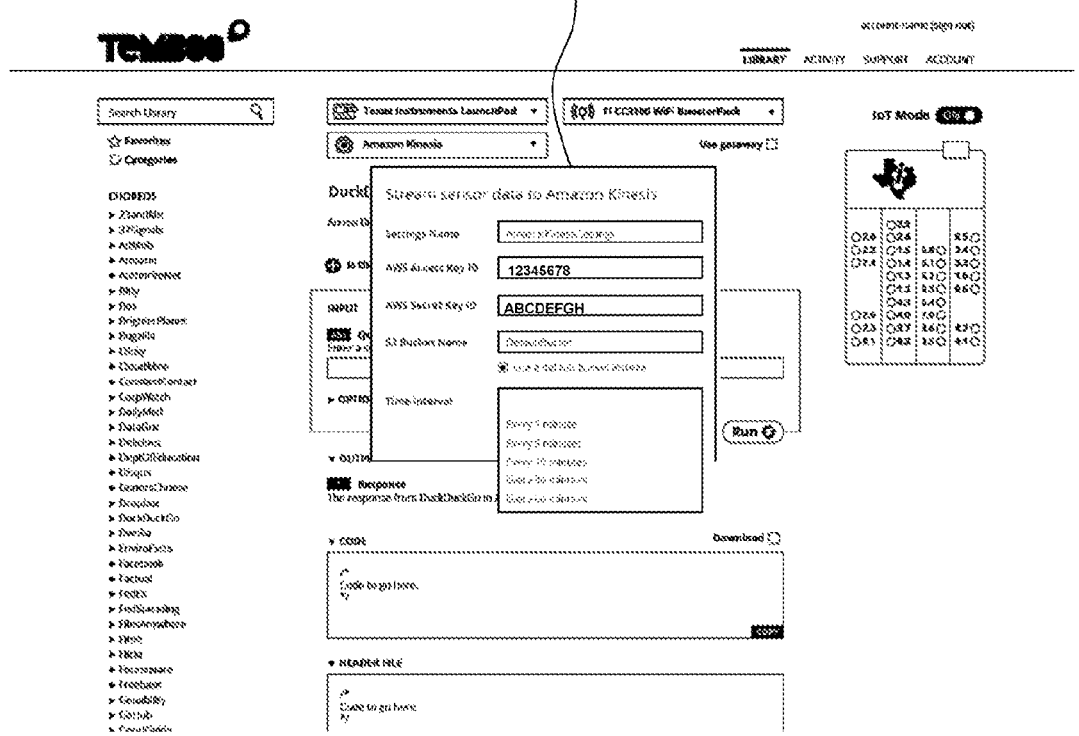

As mentioned above, a user may select a pin to be used to stream data and/or push/pull/send data to/from an external data service. FIG. 7 depicts a GUI 700 comprising a pull down menu 702 through which a user may select an external data service, e.g., Amazon Kinesis, Google BigQuery, Microsoft Power BI, and the like. Once the services is selected, the user complete the settings for the functionality of the data service, including security keys, data transmission interval, and the like. FIG. 8 depicts a GUI 800 comprising a pop-up box 802 into which such setting parameters can be defined. Various services will have differing parameter requirements.

Once the service is defined, a user selects a pin through which the data is to be streamed and or otherwise communicated to/from the service. In some embodiments, the pin may be selected first and the service selected second. The order of selection is not relevant.

Figure 9:
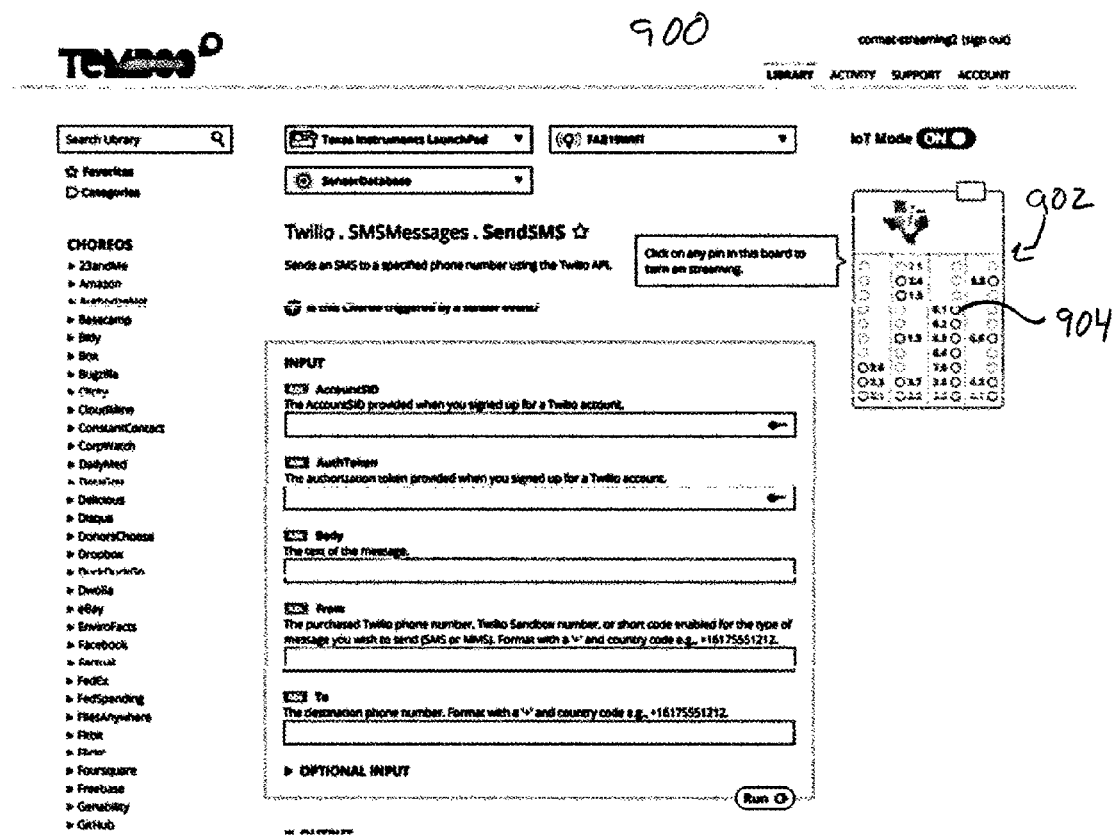

FIG. 9 depicts a GUI 900 through which the pin for data communication can be selected. The GUI 900 comprises a pin map 902 within which a pin 904 may be selected. In one embodiment, user merely moves a cursor to the pin and clicks. Other forms of selection may be used, e.g., touch screen. Upon selection of the pin, the data to be communicated is selected and the type of data to be communicated is also defined, e.g., analog or digital. In this manner, through interaction with a GUI, a user may define a data service and select a pin through which data is to be communicated (e.g., streamed, pushed, pulled, sent and the like). The software to implement the command is automatically generated and loaded on the device 130 of FIG. 1.

Figure 10:
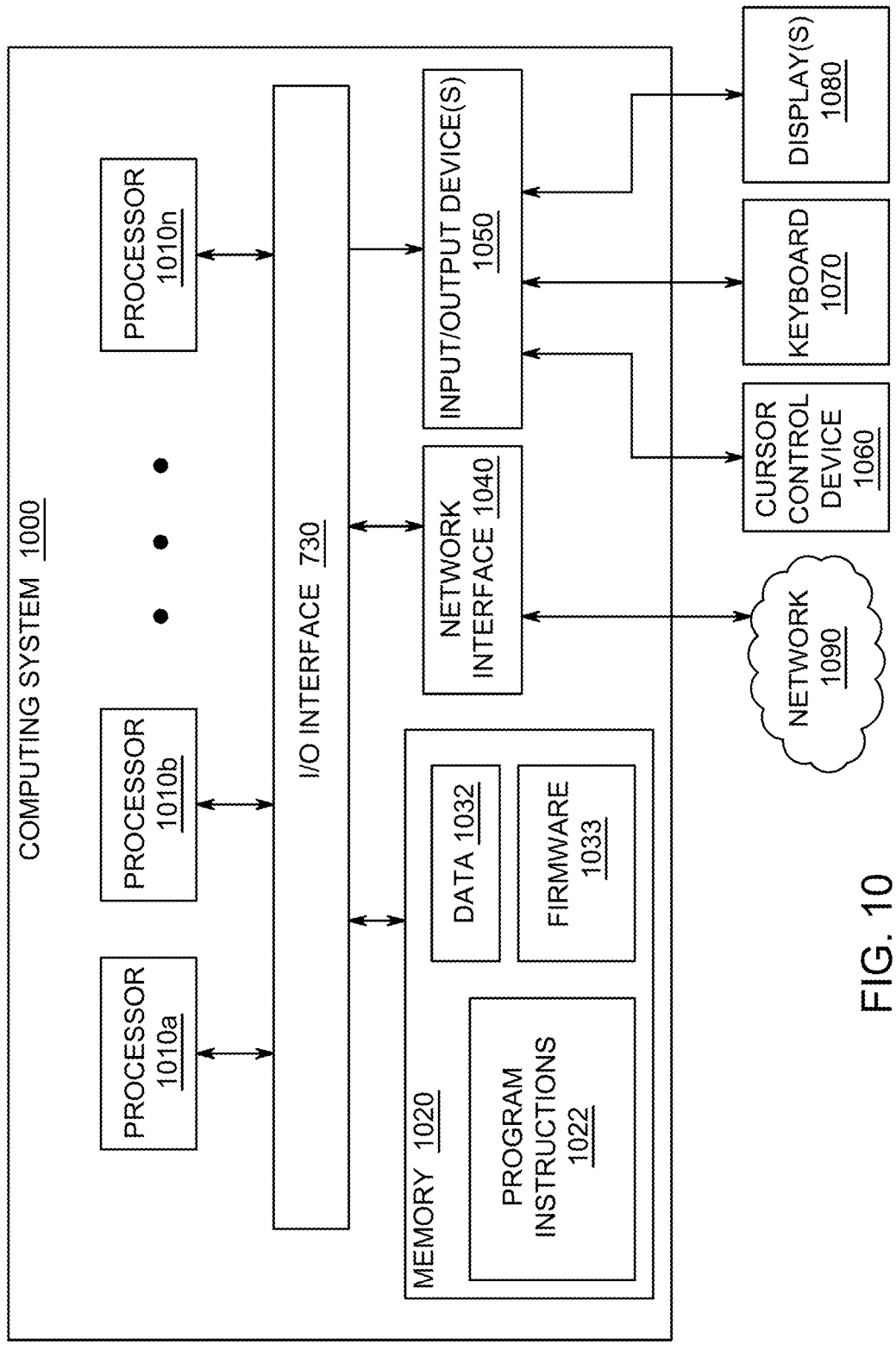
FIG. 10 is a block diagram of modules within an exemplary computing system in accordance with one or more embodiments of the present invention. The computer system comprises substantially similar structure comprising servers or electronic devices in the aforementioned embodiments.

FIG. 10 is a block diagram of modules within an exemplary computing system 1000 in accordance with one or more embodiments of the present invention. The computer system comprises substantially similar structure comprising servers or electronic devices in the aforementioned embodiments.

Various embodiments of methods and apparatus for automatic electronic device program generation. One such computer system is the system 100 illustrated by FIG. 1, which may in various embodiments implement any of the elements or functionality illustrated in FIGS. 1-6. In various embodiments, computer system 1000 may be configured to implement methods described above. The computer system 1000 may be used to implement any other system, device, element, functionality or method of the above-described embodiments. In the illustrated embodiments, computer system 1000 may be configured to implement methods 400, 500, and 600 as processor-executable executable program instructions 1022 (e.g., program instructions executable by processor(s) 1010) in various embodiments.

In the illustrated embodiment, computer system 1000 includes one or more processors 1010*a*-1010*n* coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. In some embodiments, the keyboard 1070 may be a touchscreen input device.

In various embodiments, any of the components may be utilized by the system to virtualize firmware described above. In various embodiments, a user interface may be generated and displayed on display 1080. In some cases, it is contemplated that embodiments may be implemented using a single instance of computer system 1000, while in other embodiments multiple such systems, or multiple nodes making up computer system 1000, may be configured to host different portions or instances of various embodiments. For example, in one embodiment some elements may be implemented via one or more nodes of computer system 1000 that are distinct from those nodes implementing other elements. In another example, multiple nodes may implement computer system 1000 in a distributed manner.

In different embodiments, computer system 1000 may be any of various types of devices, including, but not limited to, personal computer systems, mainframe computer systems, handheld computers, workstations, network computers, application servers, storage devices, a peripheral devices such as a switch, modem, router, or in general any type of computing or electronic device.

In various embodiments, computer system 1000 may be a uniprocessor system including one processor 1010, or a multiprocessor system including several processors 1010 (e.g., two, four, eight, or another suitable number). The uniprocessor system including a one processor 1010 may split functionality of the single processor to appear as multiple processors for processing and executing simultaneous data of a program. Processors 1010 may be any suitable processor capable of executing instructions. For example, in various embodiments processors 1010 may be general-purpose or embedded processors implementing any of a variety of instruction set architectures (ISAs). In multiprocessor systems, each of processors 1010 may commonly, but not necessarily, implement the same ISA.

System memory 1020 may be configured to store program instructions 1022, firmware 1033, and/or data 1032 accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 1020. In other embodiments, program instructions and/or data may be received, sent or stored upon different types of computer-accessible media or on similar media separate from system memory 1020 or computer system 1000.

In one embodiment, I/O interface 1030 may be configured to coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network (e.g., network 1090), such as one or more external systems or between nodes of computer system 1000. In various embodiments, network 1090 may include one or more networks including but not limited to Local Area Networks (LANs) (e.g., an Ethernet or corporate network), Wide Area Networks (WANs) (e.g., the Internet), wireless data networks, cellular networks, Wi-Fi, some other electronic data network, or some combination thereof. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, touchscreens, scanning devices, voice or optical recognition devices, or any other devices suitable for entering or accessing data by one or more computer systems 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

In some embodiments, the illustrated computer system may implement any of the methods described above, such as the methods illustrated by the flowchart of FIGS. 3-5. In other embodiments, different elements and data may be included.

Those skilled in the art will appreciate that computer system 1000 is merely illustrative and is not intended to limit the scope of embodiments. In particular, the computer system and devices may include any combination of hardware or software that can perform the indicated functions of various embodiments, including computers, network devices, Internet appliances, smartphones, tablets, PDAs, wireless phones, pagers, and the like. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

The methods described herein may be implemented in software, hardware, or a combination thereof, in different embodiments. In addition, the order of methods may be changed, and various elements may be added, reordered, combined, omitted or otherwise modified. All examples described herein are presented in a non-limiting manner. Various modifications and changes may be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present invention, other and further embodiments of the invention may be devised without departing from the basic scope thereof, and the scope thereof is determined by the claims that follow.

The invention claimed is:

1. A computer-implemented method for automatic generation of a device program comprising:
   selecting a physical controller from among a user interactive visual representation of each of a plurality of physical controllers displayed in a graphical user interface (GUI) on a user device, wherein the selected physical controller is external to the user device and is communicatively coupled to the user device;
   displaying, in the GUI, a plurality of operations for execution by the external physical controller;
   selecting, in the GUI, at least one operation from among the plurality of operations for execution by the external physical controller, wherein the at least one operation comprises communicating data with an external data service, and wherein the external data service is executed remotely from the user device and the external physical controller;
   generating, in the GUI, a user interactive pin layout comprising at least one pin for the external physical controller;
   selecting, in the GUI, a pin from the user interactive pin layout;
   receiving, in the GUI, parameter data for the at least one operation from at least one of a data entry field in the GUI or an external database;
   associating the pin from the user interactive pin layout to the received parameter data for the at least one operation;
   automatically generating, at the user device, a device program for the external physical controller based on the user interactive pin layout, the received parameter data for the at least one operation, and the at least one operation, wherein the device program comprises executable instructions for performing the at least one operation; and
   sending, from the user device, the device program for storage in a memory on the external physical controller and for execution on the external physical controller.

2. The computer-implemented method of claim 1, wherein communicating data with the external data service comprises at least one of streaming data, pushing data, pulling data, or sending data.

3. The computer-implemented method of claim 1, wherein the external data service comprises at least one of data storage or data processing services.

4. The computer-implemented method of claim 1, wherein communicating data with the external data service comprises at least one of streaming data, pushing data, pulling data, or sending data, and wherein the external data service comprises at least one of data storage or data processing services.

5. An apparatus for automatic generation of a device program comprising:
   a display;
   a processor; and
   a memory storing processor-executable instructions including:
      a visual controller module configured to:
         select a physical controller from among a user interactive visual representation of each of a plurality of physical controllers displayed in a graphical user interface (GUI) on a user device, wherein the selected physical controller is external to the user device and is communicatively coupled to the user device;
         display, in the GUI, a plurality of operations for execution by the external physical controller;
         select, in the GUI, at least one operation from among the plurality of operations for execution by the external physical controller, wherein the at least one operation comprises communicating data with an external data service, and wherein the external data service is executed remotely from the user device and the external physical controller;
         generate, in the GUI, a user interactive pin layout comprising at least one pin for the external physical controller;
         select, in the GUI, a pin from the user interactive pin layout;
         receive, in the GUI, parameter data for the at least one operation from at least one of a data entry field in the GUI or an external database;
         associate the pin from the user interactive pin layout to the received parameter data for the at least one operation;
         automatically generate, at the user device, a device program for the external physical controller based on the user interactive pin layout, the received parameter data for the at least one operation, and the at least one operation, wherein the device program comprises executable instructions for performing the at least one operation; and
         send, from the user device, the device program for storage in a memory on the external physical controller and for execution on the external physical controller.

6. The apparatus of claim 5, wherein communicating data with the external data service comprises at least one of streaming data, pushing data, pulling data, or sending data.

7. The apparatus of claim 5, wherein the external data service comprises at least one of data storage or data processing services.

8. The apparatus of claim 5, wherein communicating data with the external data service comprises at least one of streaming data, pushing data, pulling data, or sending data, and wherein the external data service comprises at least one of data storage or data processing services.

* * * * *